United States Patent
Yamada et al.

(10) Patent No.: US 7,136,166 B2
(45) Date of Patent: Nov. 14, 2006

(54) POSITION SENSOR, METHOD FOR DETECTING HORIZONTAL AND VERTICAL POSITION, ALIGNMENT APPARATUS INCLUDING POSITION SENSOR, AND METHOD FOR HORIZONTAL AND VERTICAL ALIGNMENT

(75) Inventors: Tomohiro Yamada, Kanagawa (JP); Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 449 days.

(21) Appl. No.: 10/827,327

(22) Filed: Apr. 20, 2004

(65) Prior Publication Data

US 2004/0218185 A1 Nov. 4, 2004

(30) Foreign Application Priority Data

May 1, 2003 (JP) .............................. 2003-126185

(51) Int. Cl.
- G01N 21/55 (2006.01)
- G01N 21/76 (2006.01)
- G02F 1/035 (2006.01)
- G02B 6/00 (2006.01)

(52) U.S. Cl. ............................ 356/445; 385/2; 385/12; 436/172

(58) Field of Classification Search ................ 356/128, 356/445, 134–136, 317, 318; 385/12

See application file for complete search history.

(56) References Cited

U.S. PATENT DOCUMENTS

| | | | |
|---|---|---|---|
| 5,067,788 A * | 11/1991 | Jannson et al. ................ 385/2 |
| 5,485,277 A * | 1/1996 | Foster ........................ 356/445 |
| 5,606,633 A * | 2/1997 | Groger et al. ................ 385/12 |
| 6,171,730 B1 | 1/2001 | Kuroda et al. ................ 430/5 |
| 6,545,276 B1 * | 4/2003 | Sasaki ........................ 250/310 |
| 6,753,188 B1 * | 6/2004 | Perkins et al. .............. 436/172 |
| 7,043,134 B1 * | 5/2006 | Berini et al. ................. 385/147 |
| 2002/0044285 A1 * | 4/2002 | Pedersen et al. ............ 356/445 |
| 2003/0211403 A1 | 11/2003 | Mizutani et al. .............. 430/5 |
| 2005/0046853 A1 * | 3/2005 | Sato ........................... 356/445 |
| 2006/0017931 A1 * | 1/2006 | Kimura ...................... 356/445 |

* cited by examiner

Primary Examiner—Layla G. Lauchman
(74) Attorney, Agent, or Firm—Fitzpatrick, Cella, Harper & Scinto

(57) ABSTRACT

A position sensor has an interface structure between negative dielectrics and a dielectric, and is provided with a configuration in which the plasmon intensity with respect to a microstructure in a surface including the interface structure or in the vicinity thereof is detected by the interface structure, and the positional relationship between the interface structure and the microstructure is thereby detected.

16 Claims, 12 Drawing Sheets

FIG. 5
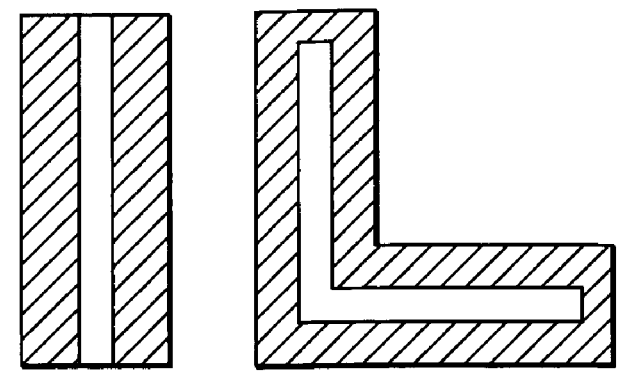
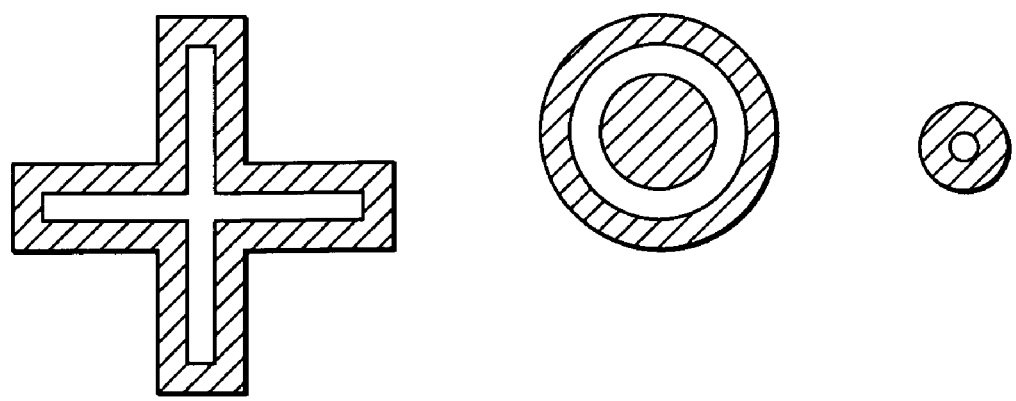
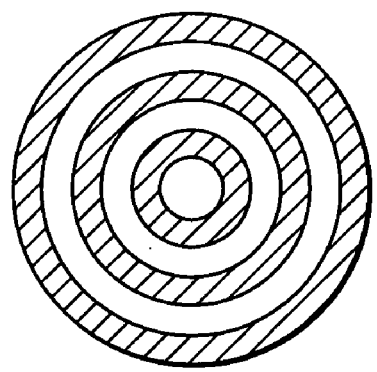
DIAGONALLY SHADED AREA : NEGATIVE DIELECTRIC
HOLLOW AREA : DIELECTRIC OR AIR LAYER DIAGONALLY SHADED AREA : NEGATIVE DIELECTRIC
HOLLOW AREA : DIELECTRIC OR AIR LAYER

POSITION SENSOR, METHOD FOR DETECTING HORIZONTAL AND VERTICAL POSITION, ALIGNMENT APPARATUS INCLUDING POSITION SENSOR, AND METHOD FOR HORIZONTAL AND VERTICAL ALIGNMENT

BACKGROUND OF THE INVENTION

1. Field of the Invention

The present invention relates to a position sensor, a method for detecting a position, an alignment apparatus including the position sensor, and a method for alignment.

2. Description of the Related Art

Contact exposure apparatuses, in which a mask pattern is brought into intimate contact with a resist on a wafer and exposure and transfer are performed, are previously known as exposure apparatuses for fabricating high-density semiconductor integrated circuits and the like.

A contact exposure apparatus that uses evanescent light is proposed as one such exposure apparatus in, for example, U.S. Pat. No. 6,171,730. The invention described in U.S. Pat. No. 6,171,730 is excellent, and makes a significant contribution to the areas of photolithography and semiconductor manufacturing technology. The exposure apparatus described in U.S. Pat. No. 6,171,730 is shown in FIG. 14.

In the apparatus shown in FIG. 14, a resist film 107 is formed on the surface of a substrate (wafer) 106 so as to prepare an object to be exposed. The substrate is attached on stage 108 and the stage 108 is driven to align the substrate 106 relative to a photomask 101. The stage 108 is driven in a direction normal to the mask surface to bring the photomask 101 into intimate contact with the resist 107 on the substrate 106, and the resist 107 is exposed to evanescent light generated in the vicinity of fine apertures on the front of the photomask 101, by the use of exposure light 110 emitted from an exposure light source 109.

With respect to the alignment between the above-described photomask and the substrate in such a contact exposure apparatus, only the alignment of the substrate (wafer) relative to the photomask has been previously performed in the two-dimensional direction on the mask surface, that is, only horizontal alignment is performed, and performing alignment through the use of a microscope observation is conventional.

However, in known contact exposure apparatuses, no device for measuring and controlling the distance between a mask and a wafer is provided, and only horizontal alignment is performed to align the mask with the wafer, as described above. Consequently, the measurement and the control of the distance between a mask and a wafer required in the case of, for example, exposure to the evanescent light by the use of an intimately contacted mask cannot be performed.

With respect to the horizontal alignment through the use of a microscope observation in a known contact exposure apparatus, the accuracy of the alignment may be on the order of 1 μm, and may not be comparable to the accuracy (100 nm or better) required of an evanescent-light exposure apparatus, for example.

If the construction of the device for measuring and controlling the distance between a mask and a wafer is attempted by the use of, for example, known distance-measuring technology, e.g., laser telemetry, the configuration of the apparatus becomes complicated significantly.

SUMMARY OF THE INVENTION

Accordingly, it is an object of the present invention to provide a position sensor capable of highly accurate detection of a position in horizontal and vertical directions without the need for a complicated mechanism, and to provide an alignment apparatus including the position sensor.

A position sensor of the present invention includes an excitation light source and an interface structure comprising a surface plasmon waveguide formed of a dielectric between negative dielectrics, and has a configuration in which the plasmon intensity with respect to a microstructure on a surface including the interface structure or in the vicinity thereof is detected by the interface structure, and the positional relationship between the interface structure and the microstructure is thereby detected.

In the position sensor of the present invention, desirably, interfaces of the interface structure are parallel to each other, and normals to the interface structure are present in the same plane.

The position sensor of the present invention may have a plurality of interface structures, and may have a configuration in which the above-described interface structures are arranged close to each other.

The position sensor of the present invention may have a configuration in which the plurality of interface structures are arranged in the shape of a straight line, a cross, a ring, or an array.

A method for detecting a position of a substrate in the present invention includes the step of preparing an interface structure which functions as a waveguide of surface plasmon and in which a dielectric is sandwiched between negative dielectrics and the step of detecting the positional relationship between the above-described interface structure and an object to be detected by passing excitation light through the above-described interface structure to generate localized plasmon, and detecting fluctuations of the localized plasmon due to the presence of the object to be detected.

An alignment apparatus of the present invention includes the above-described position sensor, and a substrate with a microstructure on a surface therein positioned below said interface structure, wherein plasmon intensity with respect to the microstructure on the surface is detected by the interface structure, and alignment therebetween is performed.

In the alignment apparatus of the present invention, the above-described interface structure may be provided in the above-described mask.

In the alignment apparatus of the present invention, the above-described interface structure may be provided substantially penetrating through the substrate of the above-described mask including the interface structure.

In the alignment apparatus of the present invention, a light-shielding layer of the above-described mask may be formed from a negative dielectric.

In the alignment apparatus of the present invention, the above-described microstructure may be made of a metal.

The alignment apparatus of the present invention may have a configuration in which the above-described microstructure is provided on a substrate to be exposed, while the microstructure may be provided as a concave portion or a convex portion.

The alignment apparatus of the present invention may have a configuration in which the height of the above-described microstructure from the surface of the above-described substrate to be exposed is larger than or nearly equal to the thickness of a photosensitive material film provided on the substrate to be exposed.

A method for alignment provided by the present invention includes the steps of preparing an interface structure comprising a surface plasmon waveguide formed of a dielectric sandwiched between negative dielectrics, the step of detecting the positional relationship between the above-described interface structure and an object on a substrate to be detected by passing excitation light through the above-described interface structure to generate localized plasmon at an outlet of the interface structure and detecting fluctuations of the localized plasmon due to the presence of the object to be detected, and the step of controlling the positions of the above-described interface structure and the above-described object to be detected based on the above-described positional relationship.

The present invention can provide a position sensor capable of detecting a position in horizontal and vertical directions with a high accuracy, on the order of 100 nm or better, without the need for a complicated mechanism, as well as an alignment apparatus including the position sensor.

According to the present invention, detection of a position as well as alignment can be performed with a high accuracy, on the order of 100 nm or better.

Further objects, features and advantages of the present invention will become apparent from the following description of the preferred embodiments with reference to the attached drawings.

BRIEF DESCRIPTION OF THE DRAWINGS

FIG. 5 is a diagram showing examples of the shape of a plasmon waveguide structure in an embodiment of the present invention.

DESCRIPTION OF THE PREFERRED EMBODIMENTS

In the position sensor of the present invention, an interface structure between negative dielectrics and a dielectric is configured, as described above. Specifically, a plasmon waveguide corresponding to a small probe is configured, and the plasmon intensity based on a structural element, e.g., a marker, in the vicinity of the waveguide outlet is detected through the use of the plasmon waveguide. As a result, the distance between the plasmon waveguide and the marker in a horizontal direction or the distance between the plasmon waveguide and the marker in a vertical direction is controlled. In the present invention, negative dielectric means a member whose dielectric permittivity is negative.

Such a plasmon waveguide will be specifically described below.

Figure 1:
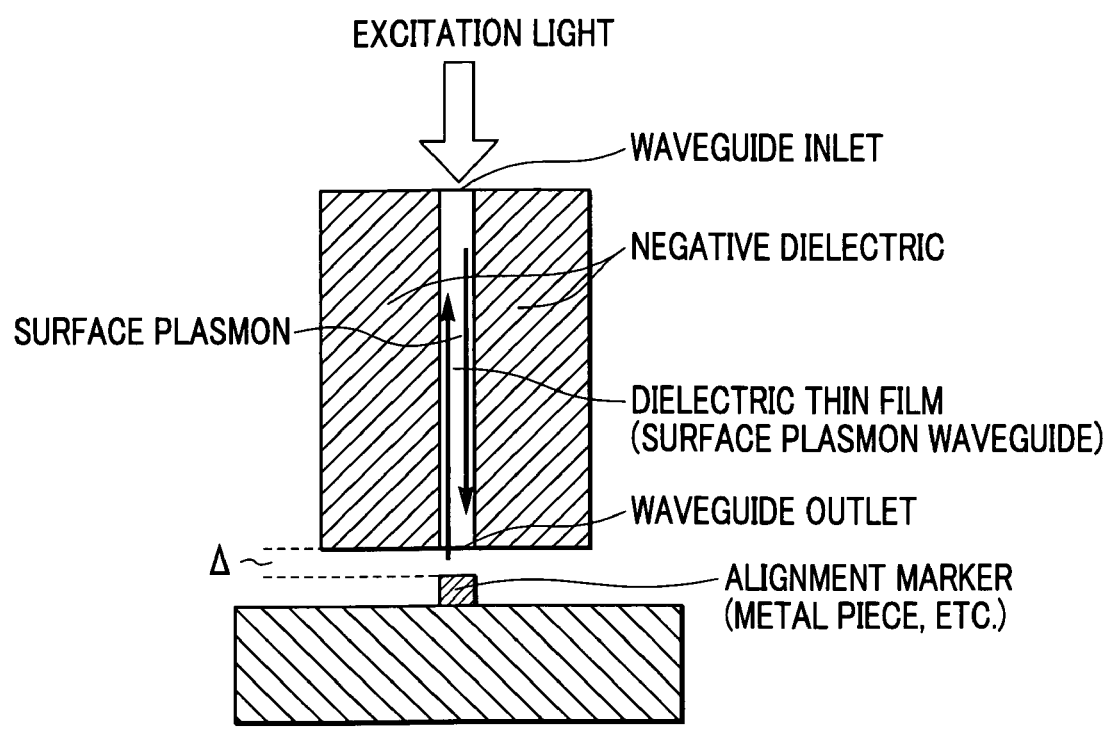
FIG. 1 is a diagram for explaining a principle of the present invention with reference to a plasmon waveguide structure in which a thin film dielectric is sandwiched between negative dielectrics in an embodiment of the present invention.

In a structure in which a thin film dielectric is sandwiched between negative dielectrics shown in FIG. 1, a coupling mode (hereafter referred to as Fano mode) of surface plasmon at both interfaces is present, and a propagation mode is included therein, while no matter how small the film thickness of the dielectric thin film is, the propagation mode has no cutoff. The beam diameter of this mode can be reduced to the size smaller than or equal to the wavelength of the light by reducing the film thickness of the dielectric thin film to a size smaller than or equal to the wavelength of the light.

FIG. 1 is a schematic diagram illustrating a Fano mode used for, e.g., alignment.

In FIG. 1, when the surface plasmon is transmitted through the dielectric thin film and reaches the waveguide outlet, localized plasmon is formed in the vicinity of the outlet. This localized plasmon expands in a region having a size nearly equal to the diameter of the waveguide outlet. If another material is present in the region in which the localized plasmon is generated, the localized plasmon is fluctuated by this material.

If a material, e.g., a metal piece, is present in the vicinity of the waveguide outlet, a part of the localized plasmon is converted to propagation light and scattered, and a part of the localized plasmon is reflected so as to return through the waveguide.

Since the reflectance of this plasmon varies depending on the dielectric constant distribution in the vicinity of the waveguide outlet, reflectances are different in the case where a photoresist is present in the vicinity of the waveguide outlet, the case where a metal is present, and the case where a semiconductor or the like is present. Consequently, when the dielectric constant is changed because, for example, another material enters a very small region of expanded localized plasmon, the localized plasmon is influenced and, thereby, the reflectivity of the surface plasmon in the vicinity of the waveguide outlet is also influenced.

The basic principle of the present invention is to detect whether any material is present in the vicinity of the waveguide outlet, and more specifically, whether any structure, e.g., a marker, is present, with a small probe referred to as "localized plasmon" through the use of the above-described principle.

In order to provide a noticeable change in reflectance, it is preferable for the region in which the dielectric constant distribution is changed to be in close proximity to the waveguide outlet. It is preferable that the distance Δ between the waveguide outlet and the material is about 100 nm or less.

Figure 2:
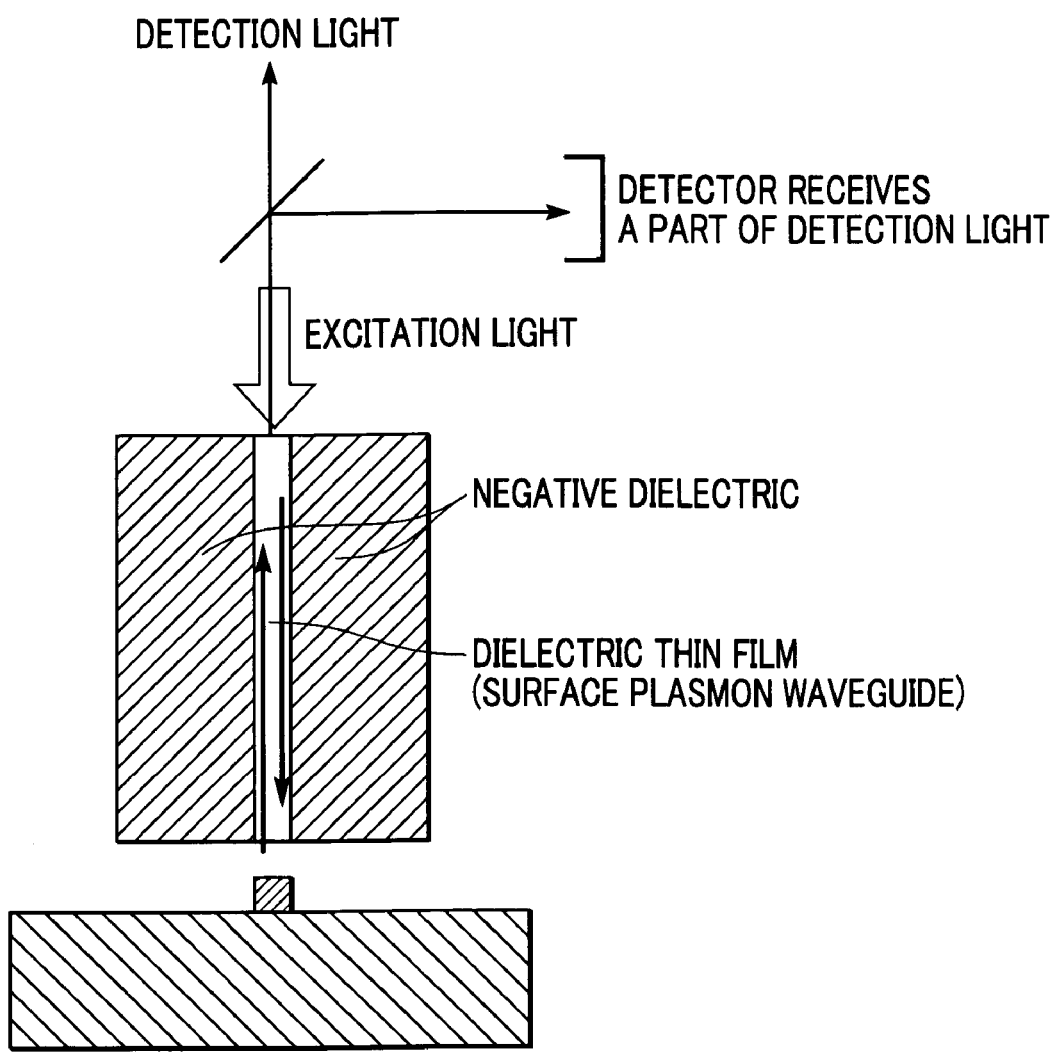
FIG. 2 is a diagram for explaining the detection of the reflection intensity of plasmon in an embodiment of the present invention.
Figure 3:
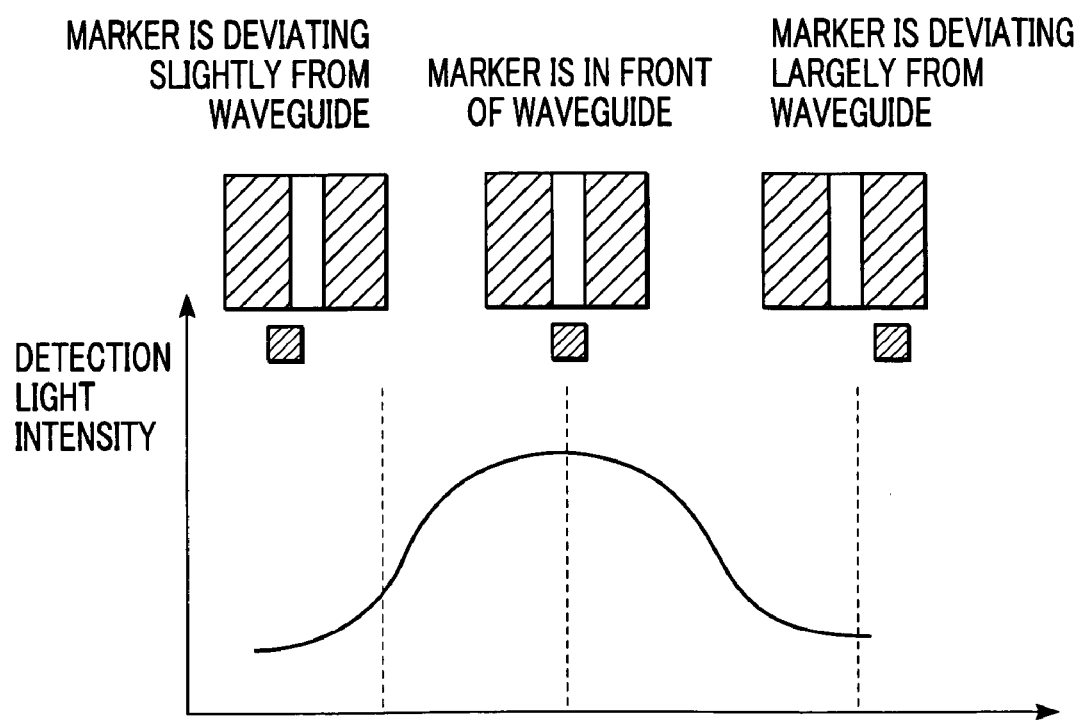
FIG. 3 is a schematic diagram showing the relationship between the amount of horizontal deviation and the reflection intensity of plasmon in an embodiment of the present invention.
Figure 4:
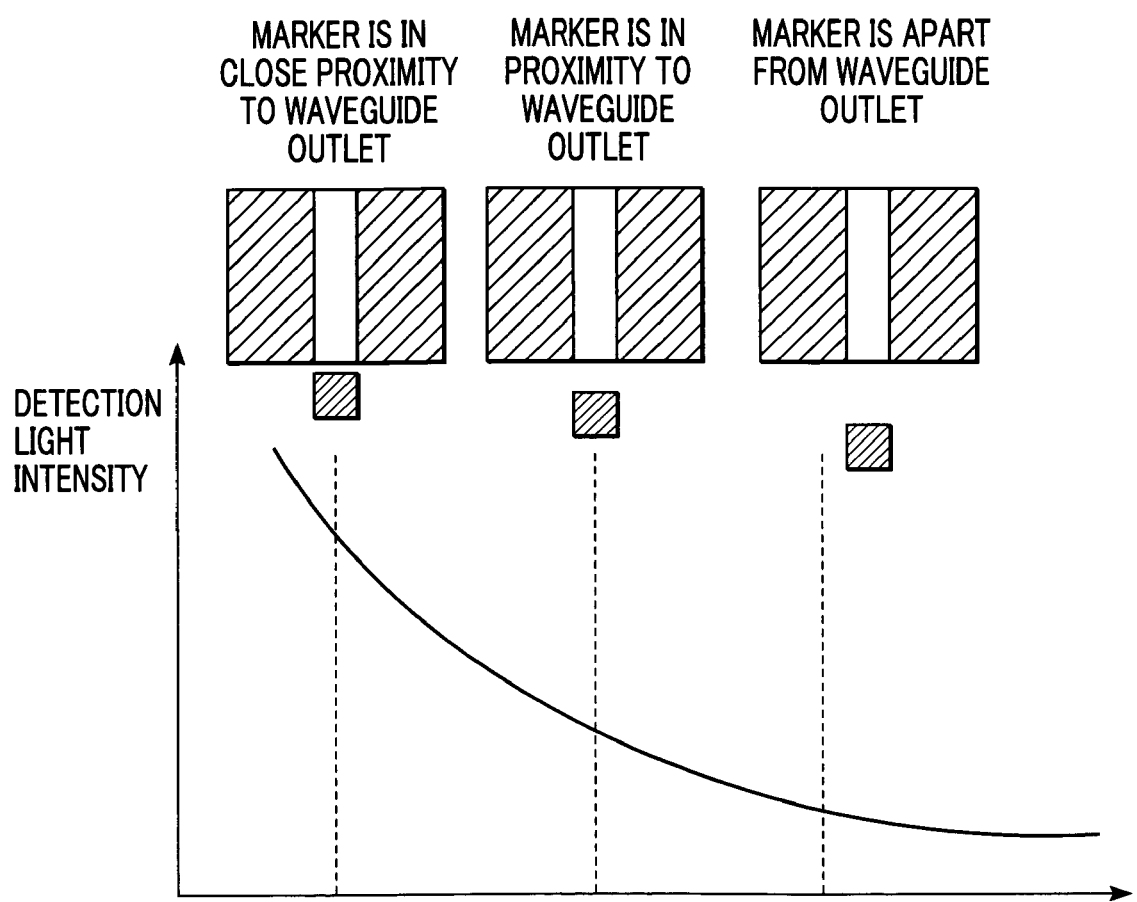
FIG. 4 is a schematic diagram showing the relationship between the distance from a waveguide to a marker in a vertical direction and the reflection intensity of plasmon in an embodiment of the present invention.

In an alignment method of the present embodiment, for example, the above-described plasmon waveguide is prepared on a photomask, and a material that functions to scatter or reflect the localized plasmon is prepared as a marker on a substrate. For example, the configuration shown in FIG. 2 is provided, and the reflection intensity of the plasmon is detected. FIG. 3 and FIG. 4 are schematic diagrams showing the change in the reflection intensity of plasmon in relation to the positional relationship between the waveguide and the marker.

When the marker is present in the vicinity of the surface plasmon waveguide outlet, the intensity of the reflected plasmon is large. On the other hand, when the marker is not present in the vicinity of the plasmon waveguide outlet (either when there is a deviation in the horizontal position or when the distance between the mask and the substrate is large), the reflection intensity of the plasmon is small. Therefore, by monitoring the reflection intensity of the plasmon, the alignment between the plasmon waveguide and the marker in a horizontal direction and the distance between the mask and the marker in a vertical direction can be determined.

In order to excite the plasmon, excitation light may be condensed in the vicinity of the plasmon waveguide inlet and applied. However, the polarization direction of the excitation light must be controlled in accordance with the shape of the plasmon waveguide. Since the plasmon is excited basically by TM wave, when the waveguide is in the shape of, for example, a slit, the excitation is preferably performed by the light polarized in the direction perpendicular to the slit. The reflection intensity of the plasmon may be measured by, for example, scanning the vicinity of the plasmon waveguide inlet with a metal microprobe or the like. Alternatively, the change in intensity of the scattered light, which is generated from the plasmon and returns to the plasmon waveguide inlet, may be measured.

With respect to the shape of the waveguide layer, it is particularly desirable that interfaces are parallel to each other, that is, the width of the waveguide layer is constant. This is because the mode of plasmon is not stable if the parallelism of the interfaces is low, and the transmission of the plasmon is hindered if the interface is not smooth.

It is desirable that the size and the shape of the marker at this time are approximately equal to the size and the shape of the outlet of the dielectric layer of the waveguide. If the size of the marker is too large relative to the area of the waveguide outlet, the alignment accuracy is reduced. If the size of the marker is too small, the detection of the change in reflectance of the plasmon becomes difficult.

The shape of the waveguide outlet and the shape of the marker are not necessarily the shape of a dot. The shape of a cross, the shape of a letter L, and the like may be adopted, as shown in FIG. 5. The shape of a ring may also be adopted.

The ring may be in the shape of concentric circles. However, it is consistently desirable that the shape of the marker is substantially equal to the shape of the dielectric layer of the plasmon waveguide. In this case as well, it is desirable that the shape of the waveguide outlet and the shape of the marker are substantially the same.

Figure 6:
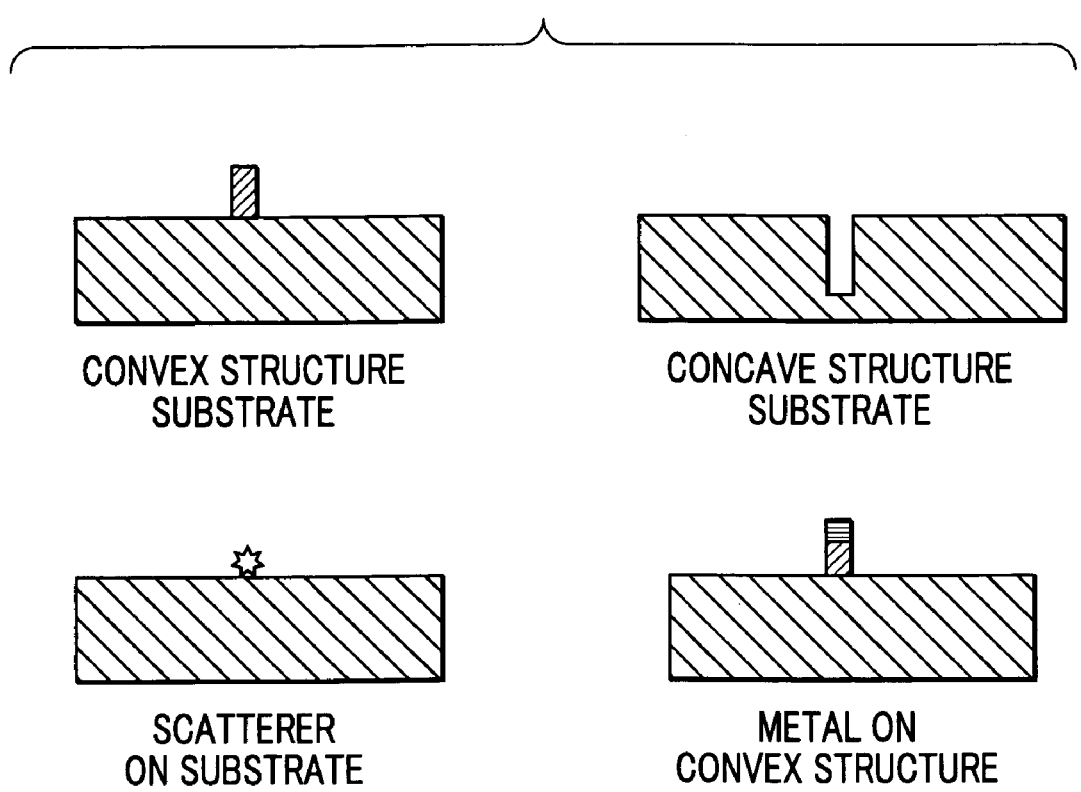
FIG. 6 is a diagram showing examples of a marker structure in an embodiment of the present invention.

As shown in FIG. 6, it is desirable for the shape of the marker to have a convex structure because the distance between the waveguide outlet and the marker can be decreased during the alignment. Since a photoresist is generally applied on the substrate, the marker having a convex structure is prepared. In addition, the thickness of the photoresist layer at the marker top is very thin and, therefore, the substantial change in dielectric constant and reflectance in the vicinity of the marker top can be readily increased. However, the substrate to be exposed may not be processed into the convex structure by the use of a batch process or other means, but some metal piece may be attached to the flat surface of the substrate to be exposed. Conversely, the substrate may be allowed to have a concave structure, and a change in reflectance and a change in dielectric constant may be effectively generated relative to the surrounding thereof. The concave structure can readily be prepared directly at the portion required to have the concave structure by the use of a focused ion beam (FIB) processing apparatus or other apparatus capable of performing fine processing.

The sizes of the marker and the waveguide outlet are allowed to become large to some extent (in the order of several micrometers) and, thereby, a shift from rough alignment to fine alignment becomes easy. The method for alignment of the present invention may be used just as fine alignment, and a rough alignment mechanism may be prepared separately.

Figure 7A:
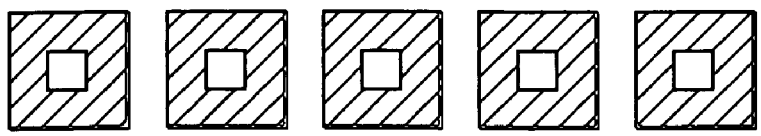
FIGS. 7A to 7C are diagrams showing examples of the arrangement of a plurality of plasmon waveguide structures in an embodiment of the present invention.
Figure 7B:
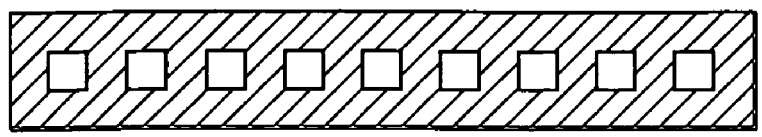
Figure 7C:
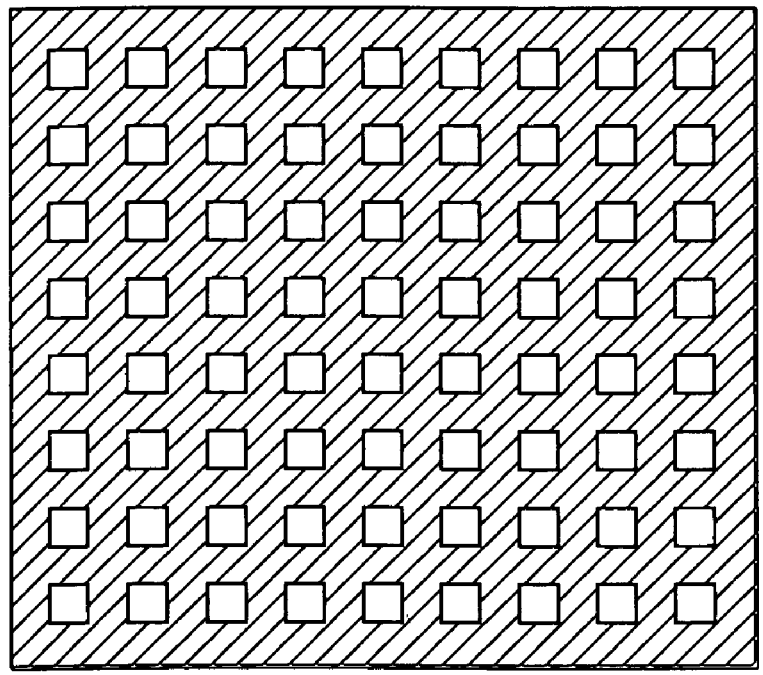

A plurality of plasmon waveguide structures and a plurality of markers may be disposed on a mask and a substrate. For example, the arrangement of them may be in the shape of a straight line or an array, as shown in FIGS. 7A to 7B, a two-dimensional array, as shown in FIG. 7C, or be in the shape of a cross or a ring.

EXAMPLE

Figure 14:
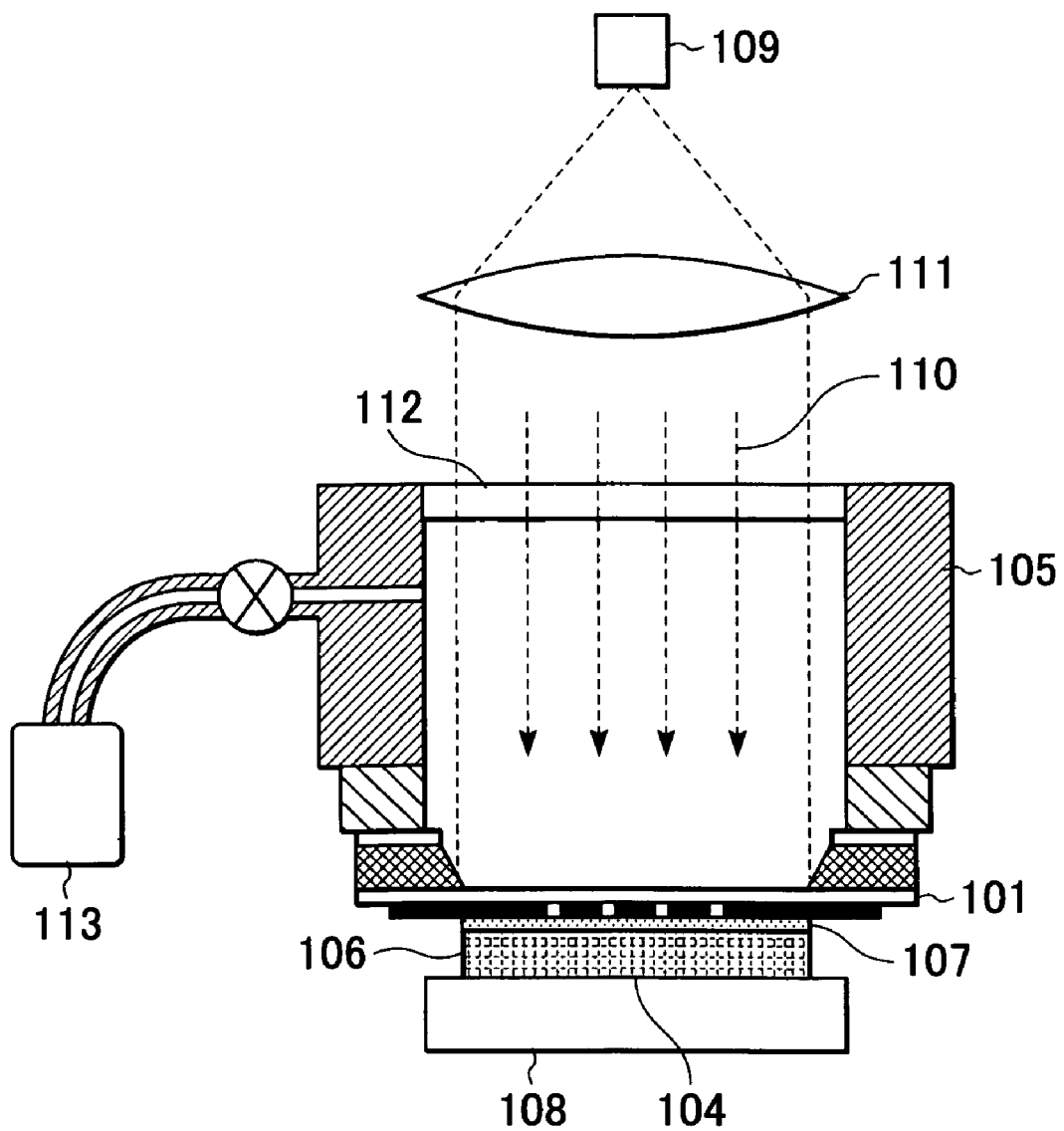
FIG. 14 is a diagram showing the configuration of an example of a known evanescent-light exposure apparatus.

With respect to this Example of the present invention, a configuration in which a plasmon waveguide structure of the present invention is incorporated in a photomask of an evanescent-light exposure apparatus, as shown in FIG. 14, will be described. In the present Example, the plasmon waveguide structure is prepared on the substrate of a photomask of the evanescent-light exposure apparatus according to the following steps.

Figure 8A:
FIGS. 8A to 8F are diagrams showing a part of the steps in an Example according to the present invention.

A Si substrate 1 with surface orientation 100 is prepared (FIG. 8A).

Figure 8B:
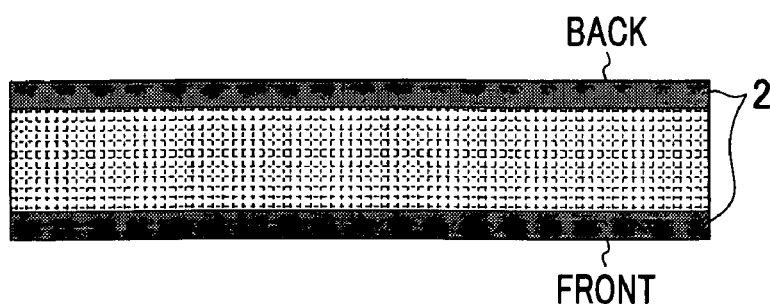

Mask matrices 2 made of $Si_3N_4$ were formed into films of 500 nm with a low pressure chemical vapor deposition apparatus (LPCVD apparatus) on both surfaces of this substrate (FIG. 8B).

Figure 8C:
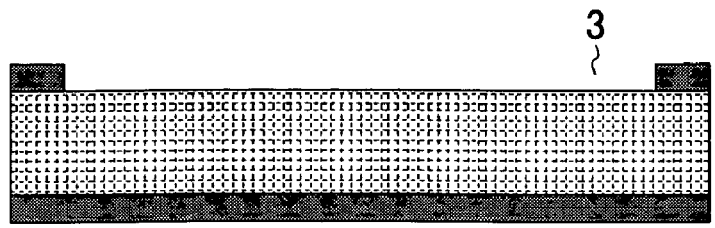

A back etch hole 3 was patterned with $CF_4$ on the back of the substrate 1 (FIG. 8C).

Figure 8D:
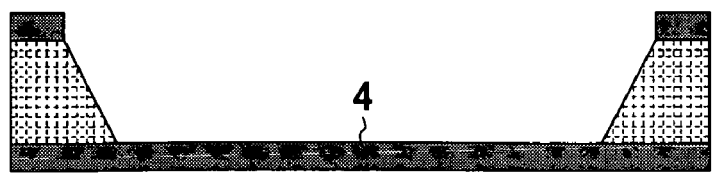

The substrate 1 was subjected to crystal axis anisotropic etching, so that a mask thin film portion 4 made of the mask matrix was formed (FIG. 8D).

Figure 8E:
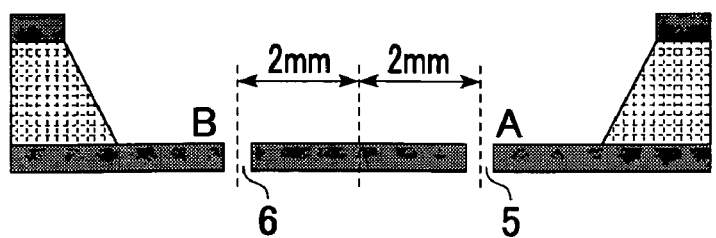

A through hole 5 and a through hole 6, each having a diameter of about 100 nm, were prepared at locations close to the end of this mask thin film portion 4 (points A and B located at a distance of 2 mm from the center of the mask thin film portion) with an FIB processing apparatus (FIG. 8E). The device for preparing the through holes is not limited to the FIB processing apparatus.

A Cr film of 40 nm serving as a metal layer 7 was formed with a metal CVD apparatus. The metal to be formed into a film with the metal CVD apparatus is not limited to Cr. Metals suitable for readily transmitting the Fano mode are particularly preferable.

Figure 8F:
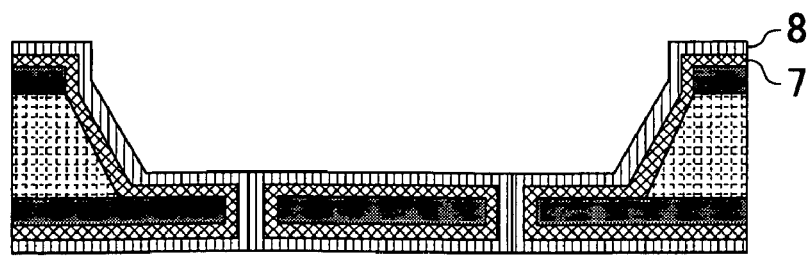

A $Si_3N_4$ film serving as a dielectric layer 8 was formed with the LPCVD apparatus, so that the through holes were filled in (FIG. 8F).

Figure 9A:
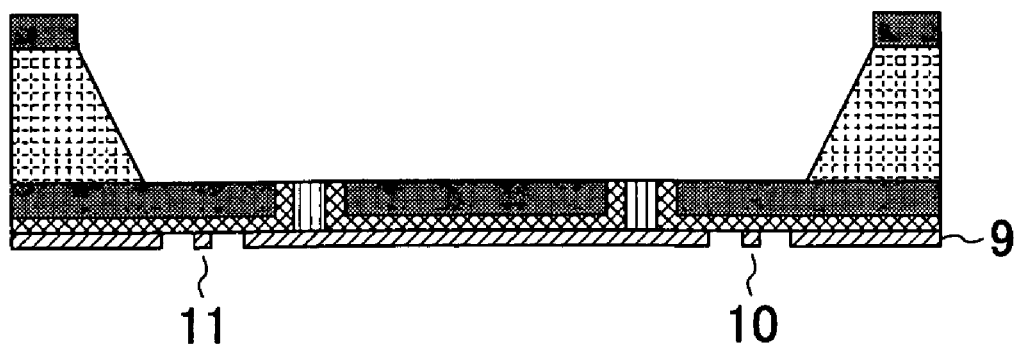
FIGS. 9A and 9B are diagrams showing a part of the steps in an Example according to the present invention.

The dielectric layers 8 on both surfaces of the substrate 1 were etched with a reactive ion etching (RIE) apparatus and, thereafter, the metal layer 7 on the back of the substrate 1 was etched with a metal RIE apparatus. As a result, the metal layer 7 and the dielectric layer 8 remained in the through holes and on the front side. A resist layer 9 was applied to the front of the substrate 1, and a pattern 10 and a pattern 11 to provide windows for rough alignment were prepared (FIG. 9A).

Figure 9B:
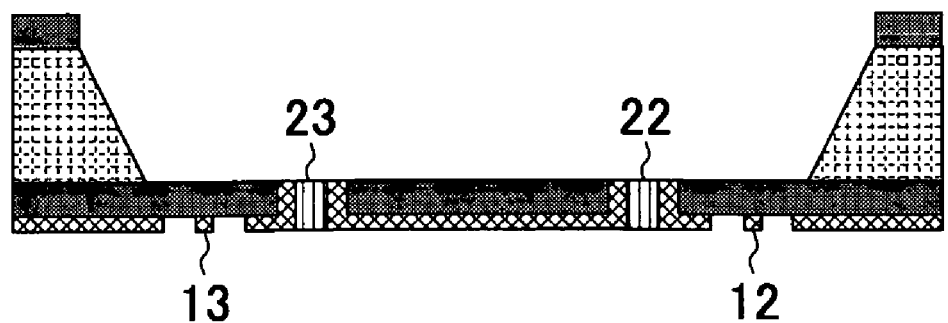
Figure 13:
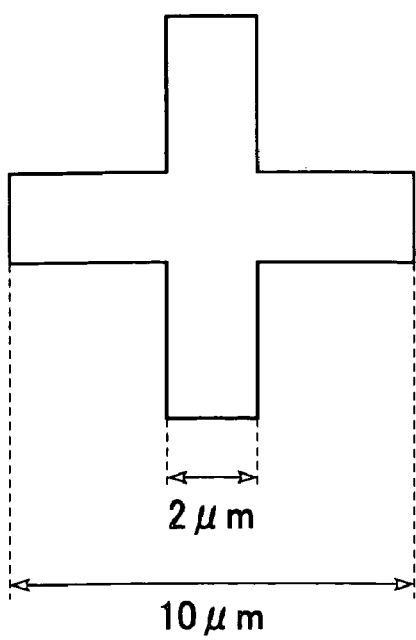
FIG. 13 is a diagram showing a part of the steps in an Example according to the present invention.

The metal layer 7 was removed from the portions corresponding to the pattern 10 and the pattern 11 by dry etching. The pattern 10 and the pattern 11 are each 1 mm square, and a marker 12 and a marker 13 for alignment were provided therein. The marker 12 and the marker 13 are each 10 μm, and are in the shape of a cross, as shown in FIG. 13. The resist layer 9 was removed, so that plasmon waveguide structures 22 and 23 were prepared on the substrate 1 (FIG. 9B).

Figure 10:
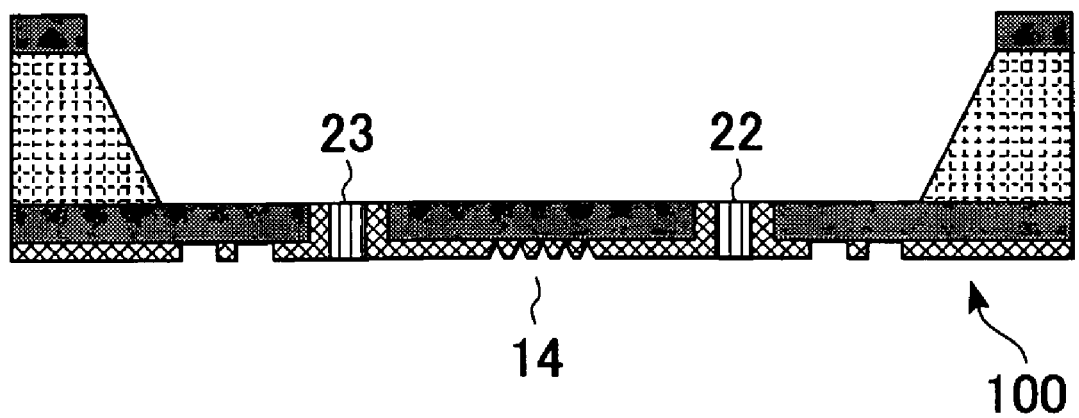
FIG. 10 is a diagram showing a part of the steps in an Example according to the present invention.

A mask pattern 14 was prepared on a desired place of the metal layer 7 of the substrate 1 (in the present Example, on the surface opposite to the back etch hole of the back), so that a photomask 100 was completed (FIG. 10).

Figure 11:
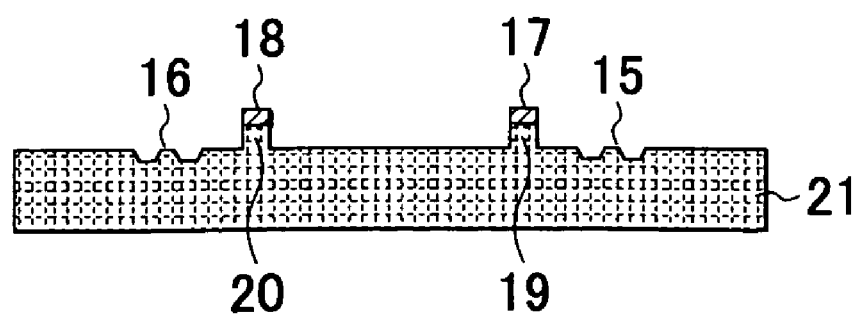
FIG. 11 is a diagram showing a part of the steps in an Example according to the present invention.

A substrate 21 provided with a marker 15, a marker 16, a marker 19, and a marker 20 for alignment was prepared beforehand as a substrate to be exposed by the use of an apparatus capable of performing electron beam (EB) processing, FIB processing, or other fine processing (FIG. 11).

This substrate 21 provided with the markers 15, 16, 19, and 20 for alignment was brought close to the photomask 100 provided with the plasmon waveguide structures 22 and 23, white light was applied to the plasmon waveguide structures 22 and 23 to excite plasmon, rough alignment was performed as described below and, thereafter, fine alignment was performed.

As the distance between the photomask 100 and the substrate 21 changes, a change in the reflection intensity of plasmon is measured. A position at which the reflection intensity of plasmon sharply changes depending on the distance between the photomask 100 and the substrate 21 is determined, and the alignment between the photomask 100 and the substrate 21 in a horizontal direction is performed.

The waveguide structure is brought above the position at which the marker is assumed to be present, the distance between the photomask 100 and the substrate 21 is decreased, and further alignment in a horizontal direction is performed. After the alignment in a horizontal direction is completed, distance control in a vertical direction is performed. The reflection intensity of plasmon is increased as the distance between the photomask 100 and the substrate 21 is decreased. When the photomask 100 and the substrate 21 is substantially brought into contact with each other, the increase in the intensity comes to a halt. Therefore, the distance between the photomask 100 and the substrate 21 is maintained to be such a distance at which the reflection intensity of plasmon is slightly smaller than the maximum.

As described above, by using the photomask 100 and the substrate 21, the alignment in a horizontal direction (horizontal direction relative to the substrate 21) can be performed with high accuracy of about 100 nm or better through a simple alignment structure. The distance control in a vertical direction (direction perpendicular to the substrate 21) can also be performed with high accuracy of about 100 nm or better.

Figure 12:
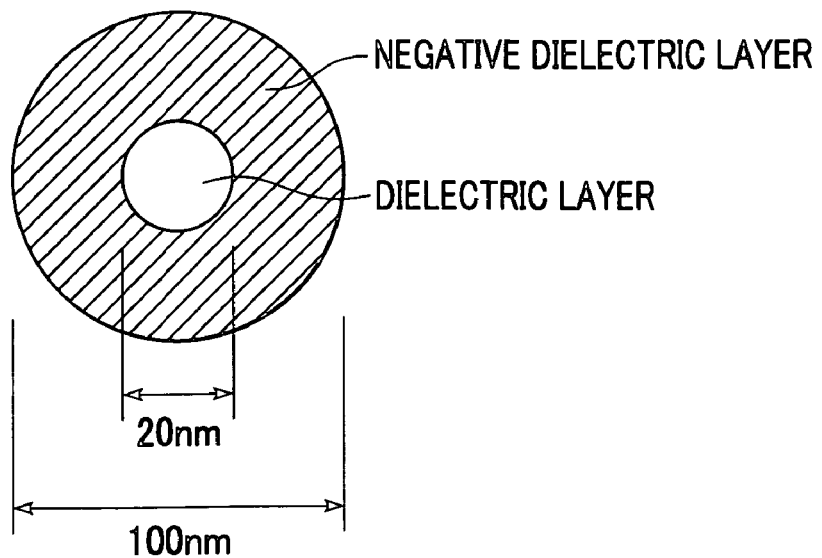
FIG. 12 is a diagram showing a part of the steps in an Example according to the present invention.

In the present Example, $Si_3N_4$ is embedded as a dielectric. However, the dielectric is not limited to this material. Air may be used. In the present Example, the waveguide structure penetrates through the photomask. However, the structure may not penetrate through the photomask. In the present Example, the marker is prepared to have the shape shown in FIG. 12. However, the shape is not limited to the shape shown in FIG. 12. Likewise, the size is not limited to the sizes explained in the present embodiment and Example.

The markers 15, 16, 19, and 20 of the substrate 21 may not be provided with the metal layer 17 nor metal layer 18 on the tops thereof.

The marker may not be the convex portion. Conversely, the marker may be a concave portion. The concave structure may be formed directly on the substrate by the use of an FIB processing apparatus or other apparatuses capable of performing fine processing. The concave structure can be prepared directly on the substrate without going through the batch process or the like and, therefore, can be prepared readily.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims.

What is claimed is:

1. A position sensor comprising:
 an excitation light source;
 an interface structure comprising a surface plasmon waveguide formed of a dielectric, said interface structure sandwiched between negative dielectrics and adapted to be positioned over a substrate.

2. The position sensor according to claim 1, wherein interfaces of said interface structure are in parallel.

3. The position sensor according to claim 1, wherein normals to the interface structure are present in the same plane.

4. The position sensor according to claim 1, further comprising a plurality of interface structures.

5. The position sensor according to claim 4, wherein the plurality of interface structures are each shaped as one of a straight line, a cross, a ring, and an array.

6. A method for detecting a position of a substrate, comprising the steps of:
 preparing an interface structure which functions as a waveguide of surface plasmon and in which a dielectric is sandwiched between negative dielectrics; and
 detecting the positional relationship between the interface structure and an object on the substrate to be detected by passing excitation light through the interface structure to generate localized plasmon at an outlet of the interface structure, and detecting fluctuations of the localized plasmon due to the presence of the object to be detected.

7. An alignment apparatus comprising:
 an excitation light source;
 an interface structure comprising a surface plasmon waveguide formed of a dielectric, said interface structure sandwiched between negative dielectrics; and
 a substrate with a microstructure on a surface therein positioned below said interface structure, wherein plasmon intensity with respect to the microstructure on the surface is detected by the interface structure, and the positional relationship between the interface structure and the microstructure is thereby detected.

8. The alignment apparatus according to claim 7, wherein the interface structure is provided in a mask.

9. The alignment apparatus according to claim 8, wherein the interface structure penetrates through the substrate of the mask comprising the interface structure.

10. The alignment apparatus according to claim 8, wherein a light-shielding layer of the mask comprises a negative dielectric.

11. The alignment apparatus according to claim 7, wherein the microstructure comprises a metal.

12. The alignment apparatus according to claim 7, wherein the microstructure is provided as a concave portion on the substrate to be exposed.

13. The alignment apparatus according to claim 12, wherein the microstructure is provided as a concave portion on the substrate to be exposed.

14. The alignment apparatus according to claim 12, wherein the microstructure is provided as a convex portion on the substrate to be exposed.

15. The alignment apparatus according to claim 7, wherein the height of the microstructure from the surface of the substrate to be exposed is at least as great as a thickness of a photosensitive material film provided on the substrate to be exposed.

16. A method for alignment, comprising the steps of:

preparing an interface structure comprising a surface plasmon waveguide formed of a dielectric sandwiched between negative dielectrics;

detecting the positional relationship between the interface structure and an object on a substrate to be detected by passing excitation light through the interface structure to generate localized plasmon at an outlet of the interface structure and detecting fluctuations of the localized plasmon due to the presence of the object to be detected; and controlling the positions of the interface structure and the object to be detected based on the detected positional relationship.

* * * * *